United States Patent
Lee et al.

(10) Patent No.: US 9,276,117 B1
(45) Date of Patent: Mar. 1, 2016

(54) STRUCTURE AND METHOD AND FINFET DEVICE

(71) Applicant: Taiwan Semiconductor Manufacturing Company, Ltd., Hsin-Chu (TW)

(72) Inventors: Yi-Jing Lee, Hsinchu (TW);
Cheng-Hsien Wu, Hsinchu (TW);
Chih-Hsin Ko, Kaohsiung County (TW); Pang-Yen Tsai, Hsin-Chu Hsian (TW); Tze-Liang Lee, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 4 days.

(21) Appl. No.: 14/463,342

(22) Filed: Aug. 19, 2014

(51) Int. Cl.
*H01L 29/78* (2006.01)
*H01L 29/66* (2006.01)

(52) U.S. Cl.
CPC ........ *H01L 29/785* (2013.01); *H01L 29/66795* (2013.01); *H01L 29/7848* (2013.01)

(58) Field of Classification Search
CPC .................................................. H01L 21/0245
USPC .......................................................... 257/401
See application file for complete search history.

(56) References Cited

U.S. PATENT DOCUMENTS

| | | | |
|---|---|---|---|
| 2002/0123167 A1* | 9/2002 | Fitzgerald | H01L 21/02381 438/47 |
| 2009/0072271 A1* | 3/2009 | Gomez | H01L 21/02381 257/190 |

* cited by examiner

*Primary Examiner* — Tuan Nguyen
(74) *Attorney, Agent, or Firm* — Haynes and Boone, LLP

(57) ABSTRACT

The present disclosure provides an embodiment of a fin-like field-effect transistor (FinFET) device. The device includes The device includes a strain-relaxed buffer (SRB) stack over a substrate, a first fin structure disposed over the SRB stack and a liner layer extending along the portion of the second SRB layer and the first semiconductor material layer of the first fin structure.

20 Claims, 8 Drawing Sheets

STRUCTURE AND METHOD AND FINFET DEVICE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-like field-effect transistor (FinFET), has been introduced to replace a planar transistor. Although existing FinFET devices and methods of fabricating FinFET devices have been generally adequate for their intended purposes, they have not been entirely satisfactory in all respects.

BRIEF DESCRIPTION OF THE DRAWINGS

Aspects of the present disclosure are best understood from the following detailed description when read in association with the accompanying figures. It is noted that, in accordance with the standard practice in the industry, various features in drawings are not drawn to scale. In fact, the dimensions of illustrated features may be arbitrarily increased or decreased for clarity of discussion.

DETAILED DESCRIPTION

Figure 1:
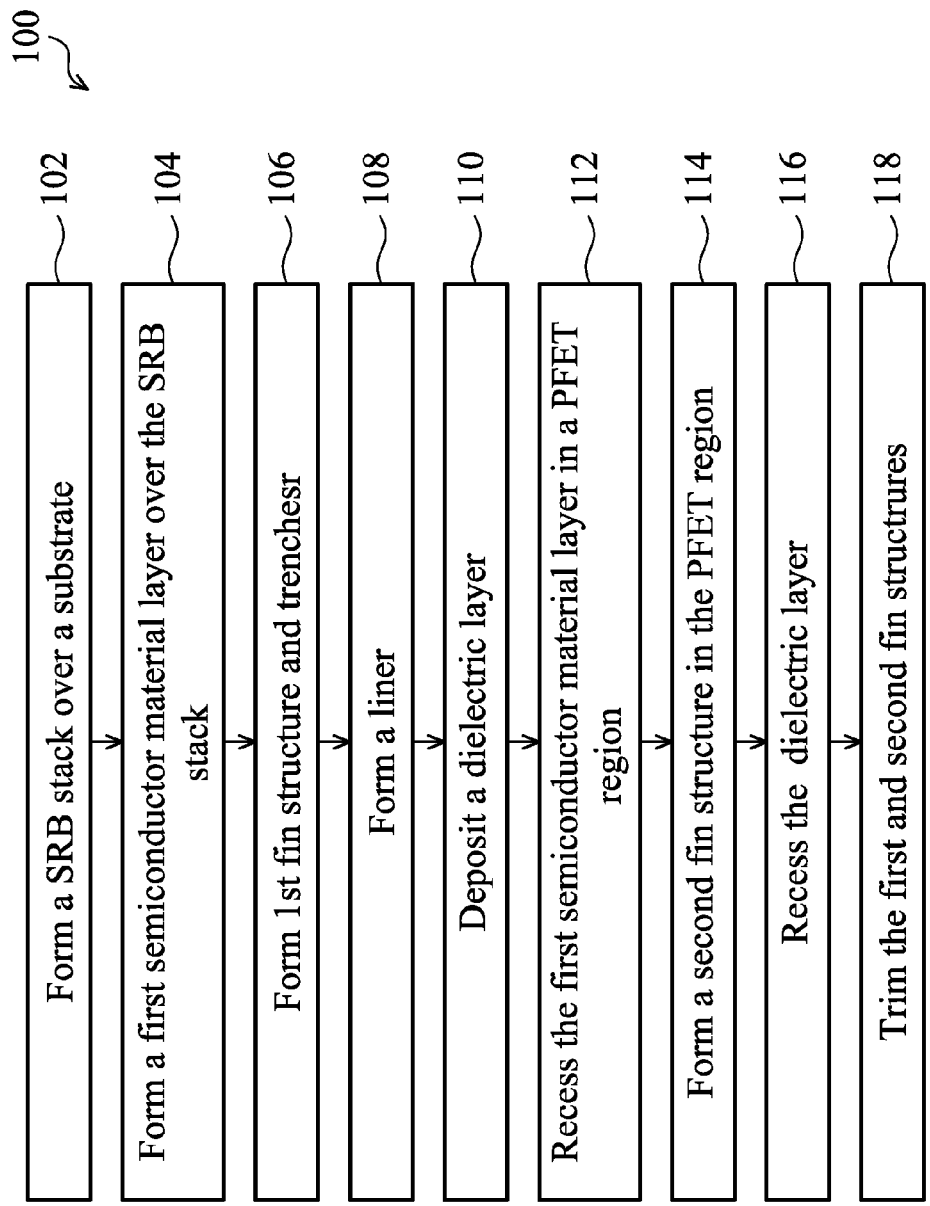
FIG. 1 is a flow chart of an example method for fabricating a FinFET device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The present disclosure is directed to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with a FinFET example to illustrate various embodiments of the present invention. It is understood, however, that the application should not be limited to a particular type of device, except as specifically claimed.

FIG. 1 is a flowchart of a method 100 for fabricating a FinFET device 200 in accordance with some embodiments. It is understood that additional steps may be implemented before, during, and after the method, and some of the steps described may be replaced or eliminated for other embodiments of the method. The FinFET device 200 and the method 100 making the same are collectively described with reference to various figures.

Figure 2:
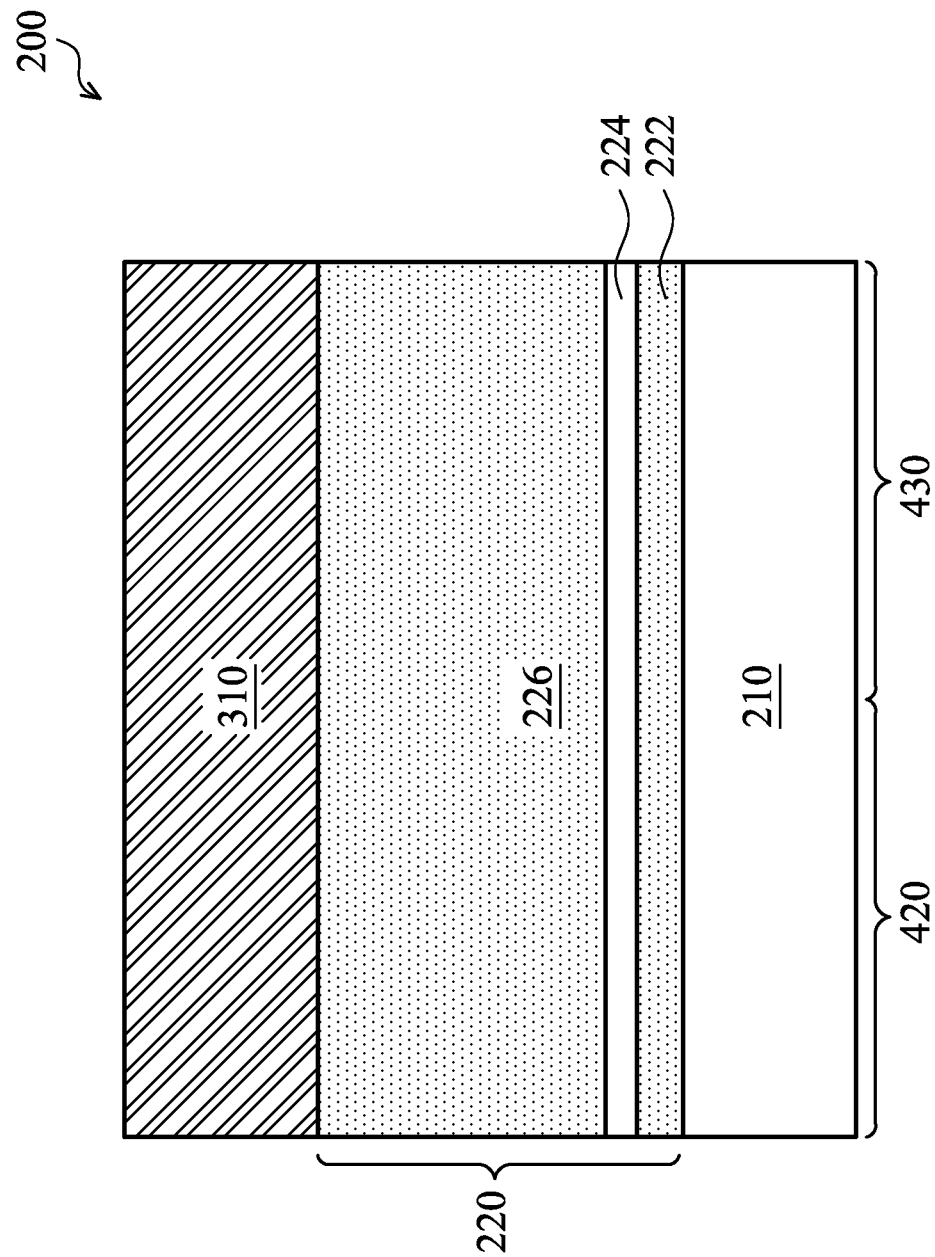
FIGS. 2 to 8 are cross-sectional views of an example FinFET at fabrication stages constructed according to the method of FIG. 1.

Referring to FIGS. 1 and 2, the method 100 begins at step 102 by forming a strain-relaxed buffer (SRB) stack 220 over a substrate 210. The substrate 210 may include a bulk silicon substrate. Alternatively, the substrate 210 may include an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof.

In another embodiment, the substrate 210 has a silicon-on-insulator (SOI) structure with an insulator layer in the substrate. An exemplary insulator layer may be a buried oxide layer (BOX). The SOI substrate may be fabricated using separation by implantation of oxygen (SIMOX), wafer bonding, and/or other suitable methods.

The substrate 210 may include various doped features depending on design requirements as known in the art. In some embodiment, the substrate 210 may include various doped regions depending on design requirements (e.g., p-type substrate or n-type substrate). In some embodiment, the doped regions may be doped with p-type or n-type dopants. For example, the doped regions may be doped with p-type dopants, such as boron or $BF_2$; n-type dopants, such as phosphorus or arsenic, and/or combination thereof. The doped regions may be configured for an n-type FinFET (NFET), or alternatively configured for a p-type FinFET (PFET).

In the present embodiment, the SRB stack 220 includes a first SRB layer 222, a dislocation trap (DisT) layer 224, and a second SRB layer 226. The first SRB layer 224 is deposited over the substrate 210, the DisT layer 224 is deposited over the first SRB layer 222 and the second SRB layer 226 is deposited over the DisT layer 224. Therefore the DisT layer 224 physically contacts the first SRB layer 222 and the second SRB layer 226 physically contacts the DisT layer 224. The SRB layers, 222 and 226, may include silicon germanium (SiGe), indium aluminum arsenide (InAlAs), indium phosphide (InP), aluminum gallium arsenide (AlGaAs), gallium arsenide (GaAs), gallium arsenide phosphide (GaAsP), and/or other suitable materials. The first and second SRB layers, 222 and 226, may be same or different materials from each other. The DisT layer 224 serves a trap layer to capture threading dislocations starting from the substrate 210.

In one embodiment, the first and second SRB layers, 222 and 226 are formed of the same material layer. For example, the first and second SRB layers, 222 and 226, are formed of a $SiGe_x$ layer, where subscript x is a Ge composition in atomic percent. The DisT layer 224, for example, is an epitaxially silicon layer. As one example, a thickness of the first $SiGe_x$ layer 222 is about 100 nm, a thickness of the DisT layer 224 is in a range of about 5 nm to about 30 nm, a thickness of the second $SiGe_x$ layer 226 is in a range of about 500 nm to about 3 um and, x is less than 50%.

The SRB stack 220 may be formed by epitaxial growth, referred to as a blanket channel epi. In one embodiment, the SRB stack 220 is formed prior to shallow trench isolation (STI) formation, which reduces process constrains (such as defect formation induced by STI formation) and improves epitaxial growing process window. In various examples, the epitaxial processes include CVD deposition techniques (e.g., vapor-phase epitaxy (VPE) and/or ultra-high vacuum CVD (UHV-CVD)), molecular beam epitaxy, and/or other suitable processes.

Referring also to FIGS. 1 and 2, the method 100 proceeds to step 104 by depositing a first semiconductor material layer 310 over the SRB stack 220. The semiconductor material layer 310 may include Ge, Si, GaAs, AlGaAs, SiGe, GaAsP, and/or other suitable materials. The semiconductor material layer 310 may be deposited by suitable epitaxial processes. In the present embodiment, the first semiconductor material layer 310 is the epitaxial silicon layer and has a thickness in a range of about 30 nm to about 70 nm.

Figure 3:
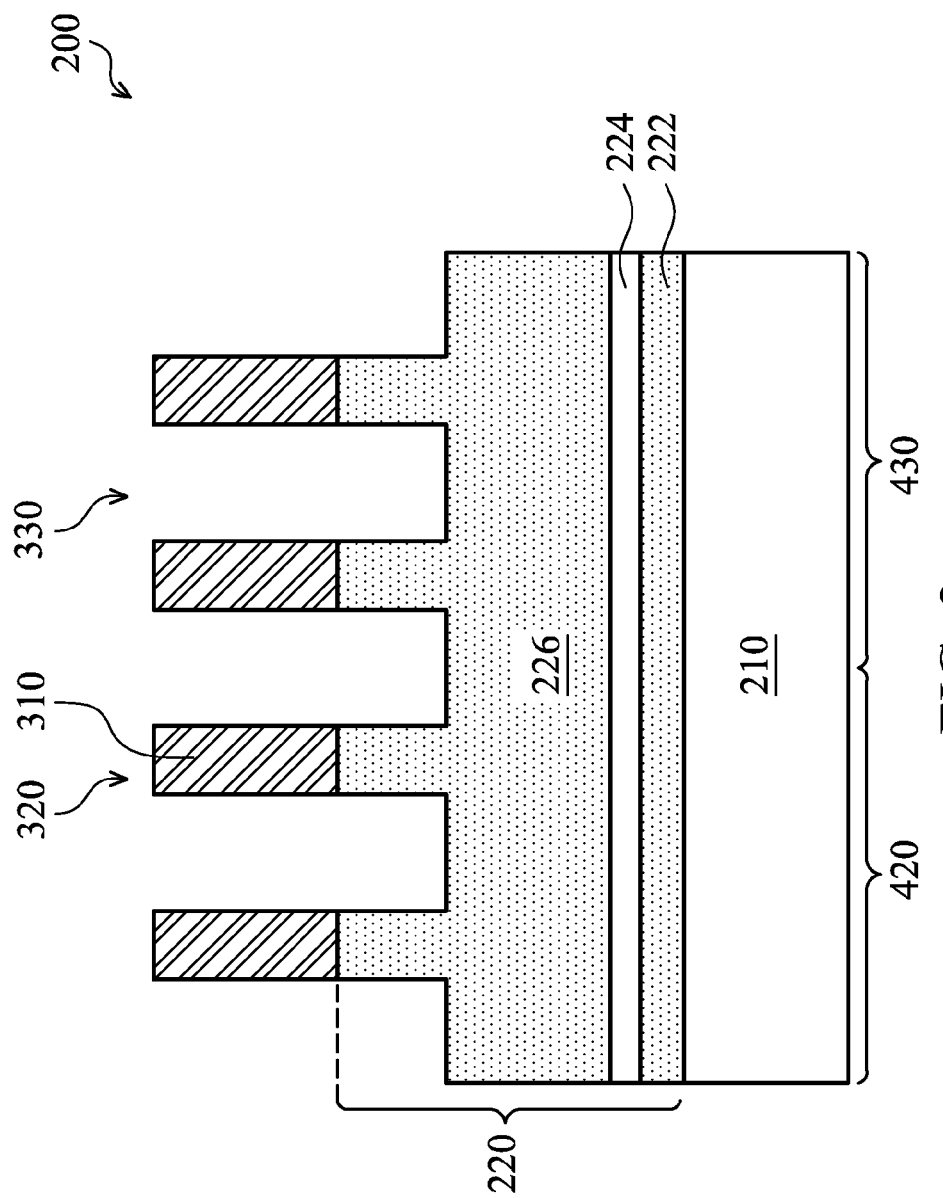

Referring to FIGS. 1 and 3, the method 100 proceeds to step 106 by forming first fin structures 320 and trenches 330 over the substrate 210. In the present embodiment, the first fin structures 320 and trenches 330 are formed by removing portions of the first semiconductor layer 310 and a portion of the second SRB layer 226. As an example, a patterned photoresist layer is formed over the first semiconductor material layer 310. The first semiconductor material layer 310 and the second SRB layer 226 are etched through the patterned photoresist layer to form the first fin structures 320 and the trenches 330. The etching process may include a wet etch or a dry etch. In one embodiment, the wet etching solution includes a tetramethylammonium hydroxide (TMAH), a HF/HNO3/CH3COOH solution, or other suitable solution. The respective etch process may be tuned with various etching parameters, such as etchant used, etching temperature, etching solution concentration, etching pressure, source power, RF bias voltage, RF bias power, etchant flow rate, and/or other suitable parameters. For example, a wet etching solution may include $NH_4OH$, KOH (potassium hydroxide), HF (hydrofluoric acid), TMAH (tetramethylammonium hydroxide), other suitable wet etching solutions, or combinations thereof. Dry etching processes include a biased plasma etching process that uses a chlorine-based chemistry. Other dry etchant gasses include $CF_4$, $NF_3$, $SF_6$, and He. Dry etching may also be performed anisotropically using such mechanism as DRIE (deep reactive-ion etching).

In the present embodiment, the etching depth is controlled such that the first semiconductor material layer 310 is fully exposed in the trench 330 and the trench 330 extends to a portion of the second SRB layer 226. Thus, the first fin structure 320 is formed in the SRB stack 220 having the DisT layer 224. Here, the first fin structure 320 has the first semiconductor material layer 310 as an upper portion and a portion of the second SRB layer 226 as a bottom portion.

Figure 4:
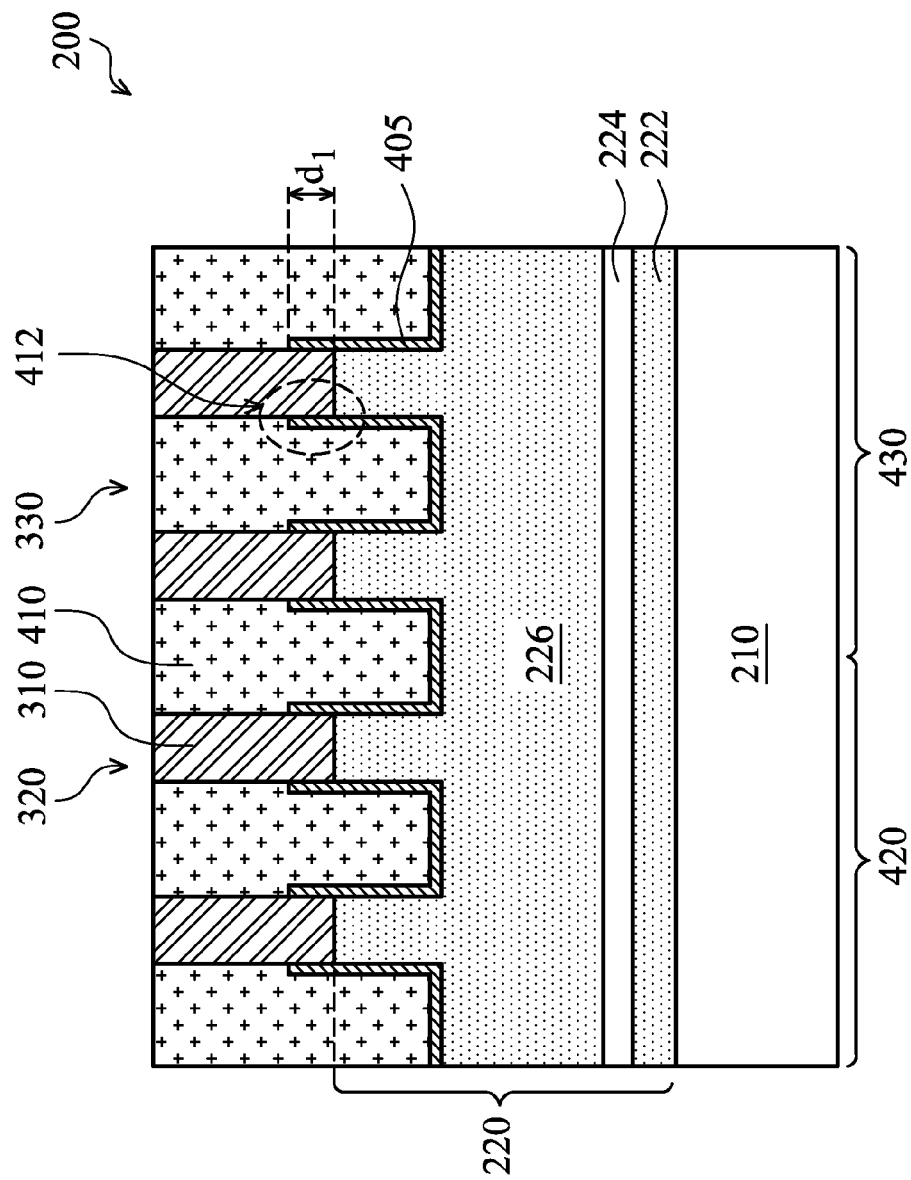

Referring to FIGS. 1 and 4, the method 100 proceeds to step 108 by forming a liner 405 to conformably wrap over sidewalls of the first fin structure 320. The liner 405 may include silicon nitride, silicon oxynitride, aluminum oxide, or other suitable materials. In the present embodiment, the liner 405 is silicon nitride and deposited by ALD to achieve adequate film coverage of wrapping over the sidewalls of the first fin structure 320. Alternatively, the liner 405 may be deposited by CVD, physical vapor deposition (PVD), or other suitable techniques. In present embodiment, the liner 405 is then recessed such that a second surface of the remaining liner 405 is below a second surface of the first semiconductor material layer 310 but above a second surface of the second SRB layer 226 a first distance $d_1$. The remaining liner 405 is designed to be a buffer layer to prevent the second SRB layer 226 to be oxidized in later processes and a barrier of out-diffusion of the second SRB layer 226, which will be described in detail below.

Referring again to FIGS. 1 and 4, the method 100 proceeds to step 110 by depositing a dielectric layer 410 over the substrate 210, including filling in the trench 330. The dielectric layer 410 may include silicon oxide, silicon nitride, silicon oxynitride, spin-on-glass, spin-on-polymer, and/or other suitable materials, and/or combinations thereof. The dielectric layer 410 may be deposited by CVD, PVD, ALD, thermal oxidation, spin-on coating, or other suitable techniques, and/or a combination thereof. A chemical mechanical polishing (CMP) process may be performed thereafter to remove excessive dielectric layer 410.

As has been mentioned previously, having the liner 405 cover the sidewalls of the second SRB layer 226, it provides a buffer to prevent adverse impacts induced during the formation of the dielectric layer 410, such as in thermal curing process for the dielectric layer 410. Also, the first distance $d_1$ is designed to be adequate to prevent an upwards-out-diffusion of the second SRB layer 226, along an interface 412 of the dielectric layer 410 and the second SRB layer 226, into the first semiconductor material layer 310, where a gate channel will be formed later. As an example, the first distance $d_1$ is adequate to prevent the upwards out-diffusion of Ge in the second SRB $SiGe_x$ layer 226, along the interface 412 of the dielectric layer 410, into the first semiconductor material layer 310. In one embodiment, the first distance $d_1$ is in a range of about 5 nm to about 30 nm.

Figure 5:
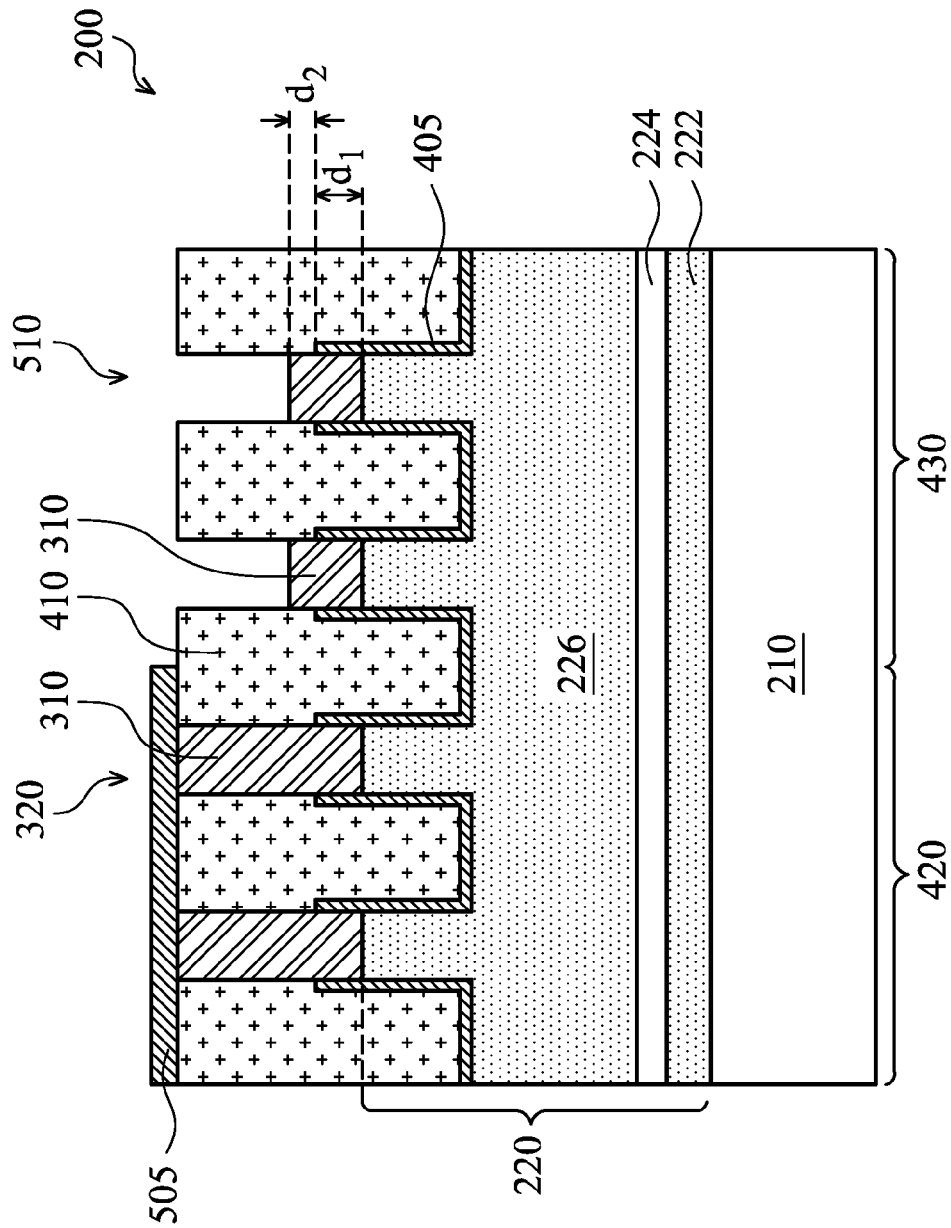

Referring also to FIGS. 1 and 5, the method 100 proceeds to step 112 by recessing the first semiconductor material layer 310 in a PFET region 430, while covering an NFET region 420 with a patterned hard mask (HM) 505. The patterned HM 505 is formed to cover the NFET region 420 and leave the PFET region 430 be un-covered. The patterned HM 505 may include silicon nitride, silicon oxynitride, silicon carbide, or any other suitable dielectric material. The patterned HM 505 may be formed by procedure including deposition, patterning and etch. Then the first semiconductor material layer 310 in the first fin structure 320 in the PFET region 430 is recessed to form trenches 510, while the NFET region 420 is protected by the patterned HM 505. The first semiconductor material layer 310 is recessed by proper etching processes, such as a selective wet etch, a selective dry etch, or a combination thereof. Alternatively, the first semiconductor material layer 310 is recessed through a patterned photoresist layer formed over the PFET region 430. The recess depth is controlled such that a second surface of the remaining first semiconductor material layer 310 is above the second surface of the liner 405 with a second distance $d_2$, which is adequate to prevent atom migration upward from the second SRB layer 226, such as Ge migration upward from the second $SiGe_y$ layer 226. In the one embodiment, the second distance $d_2$ is in a range of about 2 nm to about 20 nm. In other words, a thickness of the remaining first semiconductor material layer 310 in the trench 510 is equal to a sum of the first distance $d_1$ and the second distance $d_2$.

Figure 6:
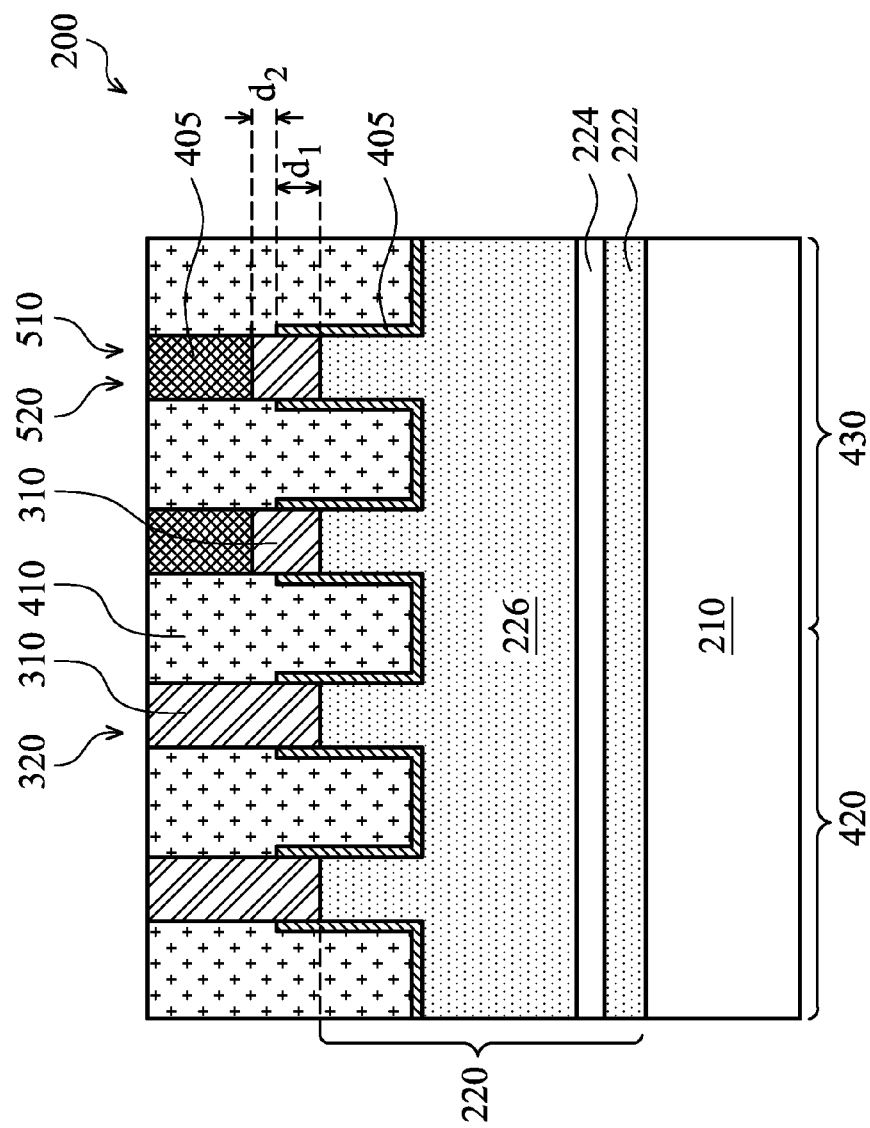

Referring to FIGS. 1 and 6, the method 100 proceeds to step 114 by forming a second fin structure 520 in the PFET region 430. A second semiconductor material layer 515 is deposited over the remaining first semiconductor material layer 310 in the trench 510 to form the second fin structure 520. The second semiconductor material layer 515 may be deposited by epitaxial growth. The epitaxial process may include CVD deposition techniques, molecular beam epitaxy, and/or other suitable processes. The second semiconductor material layer 515 may include Ge, Si, GaAs, AlGaAs, SiGe, GaAsP, and/or other suitable materials. In present embodiment, the second semiconductor material layer 515 is SiGe$_y$. Here subscript y is a Ge composition in atomic percent and it is higher than the x. In one embodiment, y is in a range of about 10% to about 100%.

A CMP process may be performed thereafter to remove excessive the second semiconductor material layer 515, as well as the patterned HM 505, and planarize the second surface of the NFET region 420 and the PFET region 430. Thus, the second fin structure 520 includes the second semiconductor material layer 515 as its upper portion, the remaining first semiconductor material layer 310 as its middle portion and a portion of the second SRB layer 226 as its bottom portion.

Figure 7:
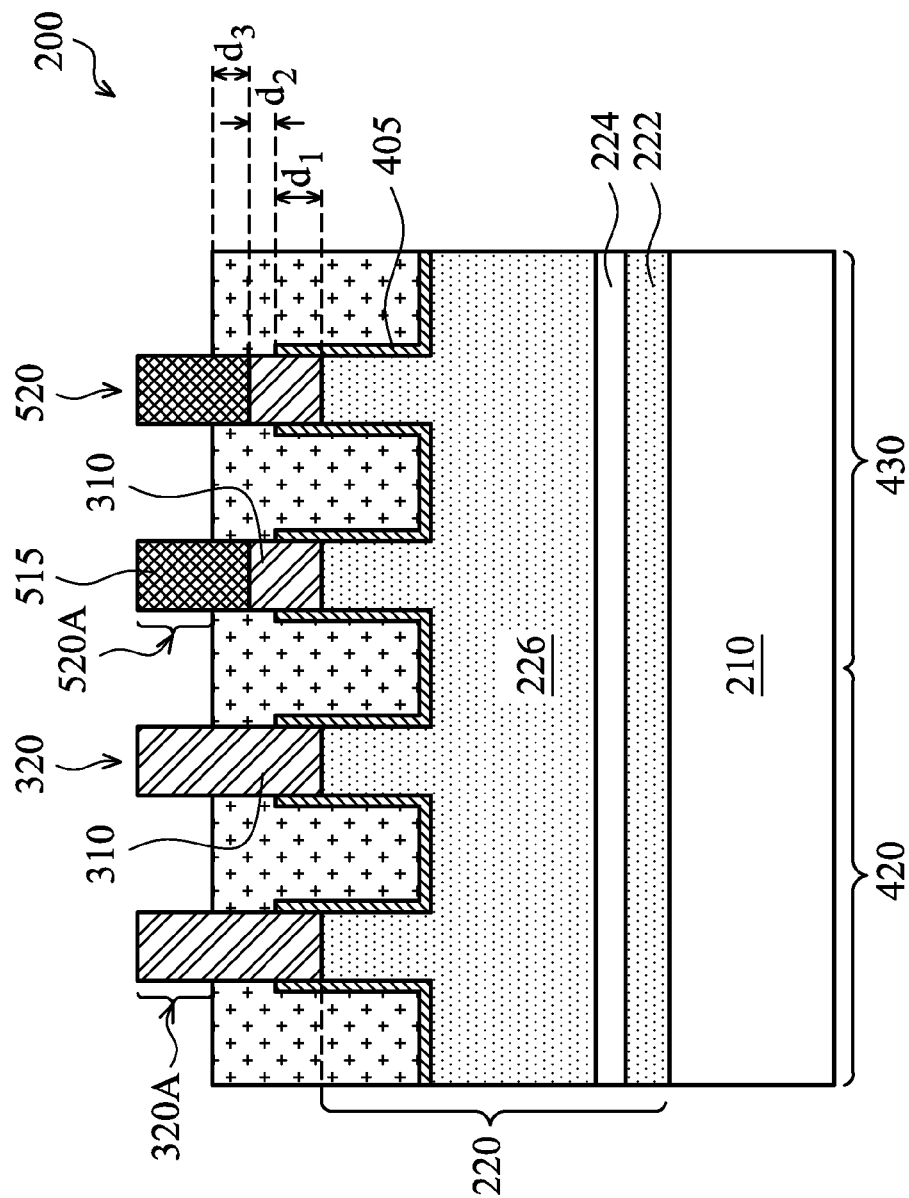

Referring to FIGS. 1 and 7, the method 100 proceeds to step 116 by recessing the dielectric layer 410 in both of the NFET region 420 and the PFET region 430 to expose a first upper portion 320A of the first structures 320 and a second upper portion 520A of the second fin structures 520. In the present embodiment, the recessing processes are controlled to have a second surface of the recessed dielectric layer 410 above the second surface of the remaining first semiconductor material layer 310 in the PFET region 430 with a third distance $d_3$. In other words, a portion of the second semiconductor material layer 515 is embedded in the remaining dielectric layer 410, with a thickness that is equal to the third distance $d_3$. The third distance $d_3$ is designed to protect the first semiconductor layer 310 in the second fin structure 520 to be etched in a subsequent etch process, which will be described later. The third distance $d_3$ is also designed to be adequate to keep the liner 405 away from an upper portion of the second fin structures, where a gate region will be formed later, to thereby avoid adverse impacts of the liner 405 to the gate region, such as fixed charges in the liner 405. In one embodiment, the third distance $d_3$ is in a range of about 5 nm to about 15 nm. Also, as shown, the first portion 320A is exposed after the dielectric layer 410 is recessed as well in the NFET region 420.

Figure 8:
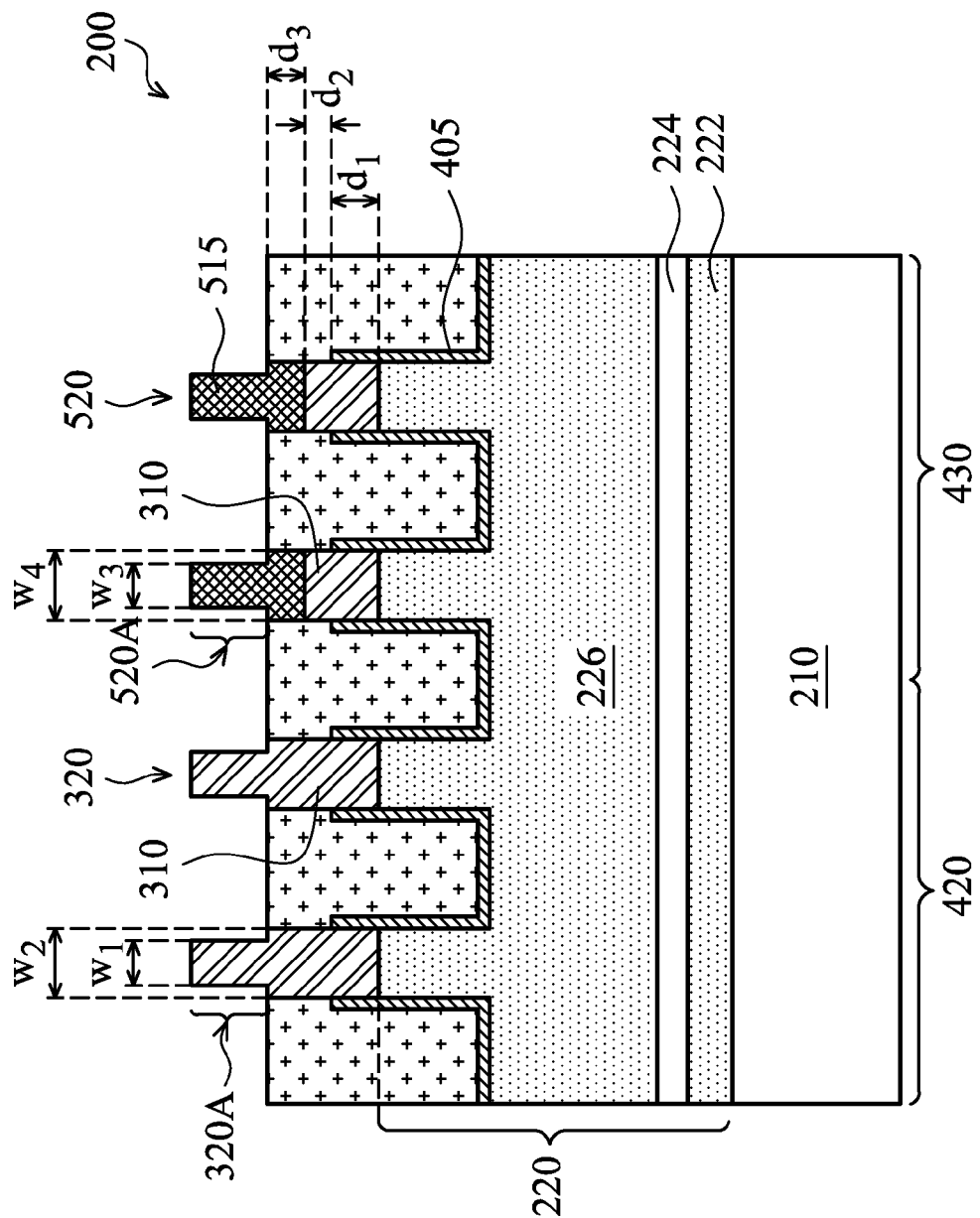

Referring to FIGS. 1 and 8, the method 100 proceeds to step 118 by trimming widths of the first portion 320A and the second portion 520A of the first and second fin structures, 320 and 520, respectively. The trimming process includes a selective wet etch, a selective dry etch, and/or a combination thereof, which does not substantially etch the remaining dielectric layer 410. In one embodiment, the trimming process includes a wet etch with etching solution including TMAH. In the present embodiment, the width of the first portion 320A is reduced from a first width $w_1$ to a second width $w_2$. In one embodiment, a ratio of the second width to the first width $w_1$ is in a range of about 75% to about 95%. And the width of the second portion 520A is reduced from a third width $w_3$ to a fourth width $w_4$. In one embodiment, a ratio of the fourth width $w_4$ to the third width $w_3$ is in a range of about 75% to about 95%.

Referring again to FIG. 8, therefore, in the NFET region 420, the first fin structure 320 is formed with a lower portion, a middle portion and an upper portion. The lower portion is formed by a portion of the second SRB layer 226, the middle portion is formed by a portion of the first semiconductor material layer 310, which has the first width $w_1$ and embedded in the dielectric layer 410, and the upper portion is the first portion 320A having a narrower width (the second width $w_2$). The first fin structure 320 contacts with the SRB stack 220, which induces strain to the upper portion of the first fin structure 320, where a channel will be formed later. With the DisT layer 224 embedded in the SRB stack 220, adverse effects of the threading dislocation are reduced. The first fin structure 320 also has the liner 405 along sidewalls of its lower portion and extending to a portion of its middle portion.

In the PFET region 430, the second fin structure 520 is also formed with a lower portion, a middle portion and an upper portion. The lower portion is formed by a portion of the second SRB layer 226. The middle portion is formed by the remaining first semiconductor material layer 310 and the embedded second semiconductor for material layer 515, which has the third width $w_3$. Its upper portion is the second portion 520A having a narrower width (the fourth width $w_4$). The second fin structure 520 contacts with the SRB stack 220, which has the DisT layer 224 be embedded in the SRB stack 220, therefore adverse effects of the threading dislocation are reduced. The remaining first semiconductor material layer 310 in the middle portion of the second fin structure prevents diffusion from the lower portion to the upper portion, where a channel will be formed layer. The second fin structure 520 also has the liner 405 along sidewalls of its lower portion and extending to a portion of its middle portion to serve as a protection layer and migration barrier.

The FinFET device 200 may also undergo further CMOS or MOS technology processing to form various features and regions known in the art. For example, high-k/metal gate (HK/MG) stacks are formed over the substrate 210 in a gate region, including over (wrapping) the first portion 320A of the first fin structure 320 in the NFET region 420 and the second portion 520A of the second fin structure 520 in the PFET region 430. For another example, source and drain (S/D) regions are formed on each side of the HK/MG stack, over the substrate 210. S/D regions may be formed by recess, epitaxial growth, and implant techniques. Subsequent processing may also form various contacts/vias/lines and multi-layers interconnect features (e.g., metal layers and interlayer dielectrics) on the substrate 210, configured to connect the various features or structures of the FinFET device 200. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Additional operations may be implemented before, during, and after the method 100, and some operations described above may be replaced or eliminated for other embodiments of the method.

Based on the above, the present disclosure offers fin structures of a FinFET and a method for fabricating the fin structure of the FinFET. The fin structure employ a SRB stack as a channel strain booster. The SRB stack is equipped with a DisT layer to reduce threading dislocation from a substrate. In a PFET region, the fin structure employs a diffusion barrier as a middle portion to prevent diffusion from its bottom portion to its upper portion. The fin structure also employs a liner extending along a lower portion of fin structure. The fin structure demonstrates device performance improvement.

The present disclosure provides an embodiment of a fin-like field-effect transistor (FinFET) device. The device includes a strain-relaxed buffer (SRB) stack over a substrate. The SRB stack includes a first SRB layer over the substrate, a dislocation-trap (DisT) layer disposed over the first SRB layer and a second SRB layer disposed over the DisT layer. The device also includes a first fin structure disposed over the SRB stack. The first fin structure includes a portion of the second SRB layer, a first semiconductor material layer disposed over the portion of the second SRB layer and a second semiconductor material layer disposed over the first semiconductor material layer. The device also includes a liner layer extending along the portion of the second SRB layer and the first semiconductor material layer of the first fin structure.

The present disclosure also provides another embodiment of a fin-like field-effect transistor (FinFET) device. The device includes a strain-relaxed buffer (SRB) stack over a silicon (Si) substrate. The SRB stack includes a first silicon germanium ($SiGe_x$) layer over the Si substrate, here x is Ge composition in atomic percent, a first epitaxial Si layer over the epitaxial $SiGe_x$ layer and a second epitaxial $SiGe_x$ layer over the epitaxial Si layer. The device also includes a first fin structure over the SRB stack. The first fin structure includes a portion of the second $SiGe_x$ layer, a second epitaxial Si layer disposed over the portion of the second $SiGe_x$ layer and a $SiGe_y$ layer disposed over the second epitaxial Si layer, here y is Ge composition in atomic percent, wherein y is larger than x. The device also includes a silicon nitride liner extending along the portion of the second $SiGe_x$ layer and a portion of the second epitaxial Si layer and a dielectric layer laterally proximate to an upper portion of the $SiGe_y$ layer, wherein a lower portion of the $SiGe_y$ is embedded in the dielectric layer.

The present disclosure also provides a method for fabricating a FinFET. The method includes forming a strain-relaxed buffer (SRB) stack over a substrate. The SRB includes a first SRB layer over the substrate, a dislocation-trap (DisT) layer over the first SRB layer and a second SRB layer over the DisT layer. The method also includes forming first fin structures over the SRB stack. The first fin structure includes a first epitaxial semiconductor material layer as its upper portion and a portion of the second SRB layer as its bottom portion. The method also includes forming a liner wrapping along sidewalls of the first fin structure, forming a dielectric layer over the substrate, including between two adjacent first fin structures, recessing the upper portion of the first fin structure in a first region while covering the first fin structure in a second region, epitaxial growing a second semiconductor material layer over the recessed first fin structure in the first region, to form a second fin structure, recessing the dielectric layer in both of the first region and the second region to expose upper portions of the first and second fin structures. A portion of the second semiconductor layer is embedded in the recessed dielectric layer. The method also includes trimming upper portions of the first and second fin structure to reduce their width.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a strain-relaxed buffer (SRB) stack over a substrate, the SRB stack including:
   a first SRB layer over the substrate;
   a dislocation-trap (DisT) layer disposed over the first SRB layer; and
   a second SRB layer disposed over the DisT layer;
   a first fin structure disposed over the SRB stack, the first fin structure including:
   a portion of the second SRB layer;
   a first semiconductor material layer disposed over the portion of the second SRB layer; and
   a second semiconductor material layer disposed over the first semiconductor material layer; and
   a liner layer extending along the portion of the second SRB layer and the first semiconductor material layer of the first fin structure.

2. The device of claim 1, wherein the second semiconductor material layer having the non-uniform width includes an upper portion having a first width and a lower portion having a second width that is different that the first width.

3. The device of claim 2, wherein a ratio of the first width to the second width is in a range of about 75% to about 95%.

4. The device of claim 2, further comprising:
   a dielectric layer laterally proximate to the upper portion of the second semiconductor material layer, wherein the lower portion of the second semiconductor material layer is embedded in the dielectric layer.

5. The device of claim 2, wherein the liner is below the upper portion of the second semiconductor material layer in a range of about 25 nm to about 35 nm.

6. The device of claim 1, wherein the DisT layer physically contacts the first SRB layer, and
   wherein the second SRB layer physically contacts the DisT layer.

7. The device of claim 1, wherein the first SRB layer and the second SRB layer include a same material, silicon germanium ($SiGe_x$), here x is Ge composition in atomic percent, wherein x is less than about 50%.

8. The device of claim 1, wherein the DisT layer includes Si layer, having a thickness in a range of about 5 nm to about 30 nm.

9. The device of claim 1, wherein the first semiconductor material layer includes epitaxial silicon (Si), having a thickness in a range of about 30 nm to about 70 nm.

10. The device of claim 1, wherein the second semiconductor material layer includes $SiGe_y$, y is in a range of about 10% to about 100%.

11. The device of claim 1, wherein the liner includes one or more materials from the group consisting of silicon nitride, silicon oxynitride and aluminum oxide.

12. The device of claim 1, further comprising:
   a second fin structure over the SRB stack, the second fin structure including:
   the portion of the second SRB layer; and
   the first semiconductor material layer disposed over the portion of second SRB layer;
   the liner extending along the portion of the second SRB layer and the first semiconductor material layer; and
   the dielectric layer laterally proximate to an upper portion of the first semiconductor material layer, wherein a lower portion of the first semiconductor material layer is embedded in the dielectric layer.

13. A fin-like field-effect transistor (FinFET) device comprising:
   a strain-relaxed buffer (SRB) stack over a silicon (Si) substrate, the SRB stack including:
   a first epitaxial silicon germanium (SiGex) layer over the Si substrate, here x is Ge composition in atomic percent;
   a first epitaxial Si layer over the first epitaxial SiGex layer; and
   a second epitaxial SiGex layer over the first epitaxial Si layer;
   a first fin structure over the SRB stack, the first fin structure including:
   a portion of the second epitaxial SiGex layer;

a second epitaxial Si layer disposed over the portion of the second epitaxial SiGex layer; and
a SiGey layer disposed over the second epitaxial Si layer, here y is Ge composition in atomic percent, wherein y is larger than x;
a silicon nitride liner extending along the portion of the second SiGex layer and a portion of the second epitaxial Si layer; and
a dielectric layer laterally proximate to an upper portion of the SiGey layer, wherein a lower portion of the SiGey is embedded in the dielectric layer.

14. The device of claim 13, wherein:
x is less than about 50%; and
y is in a range of about 10% to about 100%.

15. The device of claim 13, wherein the first epitaxial Si layer has a thickness in a range of about 5 nm to about 30 nm.

16. The device of claim 13, wherein the SiGe$_y$ layer having the non-uniform width includes an upper portion having a first width and a lower portion having a second width that is different that the first width, wherein a ratio of the first width to the second width is in a range of about 75% to about 95%.

17. The device of claim 13, wherein the first epitaxial Si layer physically contacts the first SiGe$_x$ layer, and
wherein the second SiGe$_x$ layer physically contacts the epitaxial Si layer.

18. The device of claim 13, further comprising:
a second fin structure over the SRB stack, the second fin structure including:
the portion of the second epitaxial SiGe$_x$ layer; and
the second epitaxial Si layer disposed over the portion of the second epitaxial SiGe$_x$ layer;
the silicon nitride liner extending along the portion of the second epitaxial SiGe$_x$ layer and a portion of the second epitaxial Si layer; and
the dielectric layer laterally proximate to an upper portion of the second epitaxial Si layer, wherein a lower portion of the second epitaxial Si layer is embedded in the dielectric layer.

19. A method, comprising:
forming a strain-relaxed buffer (SRB) stack over a substrate, the SRB including:
a first SRB layer over the substrate;
a dislocation-trap (DisT) layer over the first SRB layer; and
a second SRB layer over the DisT layer;
forming first fin structures over the SRB stack, the first fin structure including:
a first epitaxial semiconductor material layer as its upper portion; and
a portion of the second SRB layer as its bottom portion;
forming a liner wrapping along sidewalls of the first fin structure;
forming a dielectric layer over the substrate, including between two adjacent first fin structures;
recessing the upper portion of the first fin structure in a first region while covering the first fin structure in a second region;
epitaxial depositing a second semiconductor material layer over the recessed first fin structure in the first region, to form a second fin structure;
recessing the dielectric layer in both of the first region and the second region to expose upper portions of the first and second fin structures, wherein a portion of the second semiconductor layer is embedded in the recessed dielectric layer; and
trimming upper portions of the first and second fin structure to reduce their width.

20. The method of claim 19, the forming the first fin structure includes:
depositing the first epitaxial semiconductor material layer over the SRB stack; and
etching the first epitaxial semiconductor material layer and the portion of the second SRB layer through a patterned hard mask.

* * * * *